(12) United States Patent
Rajput et al.

(10) Patent No.: US 11,540,422 B2
(45) Date of Patent: Dec. 27, 2022

(54) SERVER RACK AND METHOD OF COOLING UTILIZING A DETERMINATION OF A HEAT EXCHANGE CONTROL PARAMETER

(71) Applicant: NEC CORPORATION, Tokyo (JP)

(72) Inventors: Nirmal Singh Rajput, Tokyo (JP); Hisato Sakuma, Tokyo (JP)

(73) Assignee: NEC CORPORATION, Tokyo (JP)

( * ) Notice: Subject to any disclaimer, the term of this patent is extended or adjusted under 35 U.S.C. 154(b) by 22 days.

(21) Appl. No.: 17/255,202

(22) PCT Filed: Jun. 26, 2018

(86) PCT No.: PCT/JP2018/024982
§ 371 (c)(1),
(2) Date: Dec. 22, 2020

(87) PCT Pub. No.: WO2020/003544
PCT Pub. Date: Jan. 2, 2020

(65) Prior Publication Data
US 2021/0274688 A1    Sep. 2, 2021

(51) Int. Cl.
*H05K 7/20*  (2006.01)
*F24F 11/88* (2018.01)
(Continued)

(52) U.S. Cl.
CPC .......... *H05K 7/20836* (2013.01); *F24F 11/88* (2018.01); *G01K 13/024* (2021.01);
(Continued)

(58) Field of Classification Search
CPC ..................... Y10T 137/0324; H05K 7/20836
(Continued)

(56) References Cited

U.S. PATENT DOCUMENTS

2012/0128507 A1* 5/2012 Scheidler ........... H05K 7/20836
                                                                417/32
2012/0247750 A1* 10/2012 Kobayashi ......... H05K 7/20836
                                                                165/287
(Continued)

FOREIGN PATENT DOCUMENTS

JP    10-089780 A    4/1998
JP   2009-104306 A   5/2009
(Continued)

OTHER PUBLICATIONS

International Search Report for PCT/JP2018/024982 dated Aug. 28, 2018 [PCT/ISA/210].

*Primary Examiner* — Suresh Suryawanshi
(74) *Attorney, Agent, or Firm* — Sughrue Mion, PLLC

(57) ABSTRACT

A server rack includes an air inlet configured to intake air from outside of the server rack, an air exhaust outlet configured to exhaust air to an outside of the server rack, an inlet temperature sensor configured to measure the temperature of inlet air, a heat exchanger provided at an air exhaust outlet of the server rack, a power consumption sensor provided to a power supply of the server rack and configured to measure electrical power consumption of the server rack, and a heat exchange controller configured to control heat exchange between the heat exchanger and the exhaust air based on measurements from the inlet temperature sensor and the power consumption sensor.

4 Claims, 10 Drawing Sheets

(51) Int. Cl.
  *G01K 13/024* (2021.01)
  *G01R 21/00* (2006.01)
  *G05B 17/02* (2006.01)
  *G06F 1/20* (2006.01)
  *G06F 1/26* (2006.01)

(52) U.S. Cl.
  CPC ............ *G01R 21/00* (2013.01); *G05B 17/02* (2013.01); *G06F 1/206* (2013.01); *H05K 7/20736* (2013.01); *G06F 1/26* (2013.01)

(58) Field of Classification Search
  USPC ........................................................ 700/282
  See application file for complete search history.

(56) References Cited

U.S. PATENT DOCUMENTS

2013/0133350 A1* 5/2013 Reytblat ............ H05K 7/20836
  62/310

2014/0233173 A1* 8/2014 Matsushita ........ H05K 7/20745
  361/679.46
2015/0056908 A1* 2/2015 Chapel ............... H05K 7/20145
  29/428
2018/0014434 A1* 1/2018 Craft, Jr. .............. H05K 7/2079

FOREIGN PATENT DOCUMENTS

| | | |
|---|---|---|
| JP | 2009-217500 A | 9/2009 |
| JP | 2011-123873 A | 6/2011 |
| JP | 2014-159923 A | 9/2014 |
| JP | 2015-161489 A | 9/2015 |
| JP | 2016-164911 A | 9/2016 |
| JP | 2016-170715 A | 9/2016 |
| JP | 2017-068485 A | 4/2017 |
| WO | 2016/031197 A1 | 3/2016 |

* cited by examiner

PRIOR ART

SERVER RACK AND METHOD OF COOLING UTILIZING A DETERMINATION OF A HEAT EXCHANGE CONTROL PARAMETER

CROSS REFERENCE TO RELATED APPLICATIONS

This application is a National Stage of International Application No. PCT/JP2018/024982 filed Jun. 26, 2018.

TECHNICAL FIELD

The present invention relates to a server rack for operation in, for example, a server room where maintaining a temperature-controlled environment is desired, a method of cooling the server rack, and a machine learning estimator for modeling the cooling control of the server rack.

BACKGROUND ART

In recent years, many organizations utilize computer networks to easily store, organize, and share large amounts of data and often require the use and maintenance of various types of server equipment. Typically, such server equipment is housed in a server rack, and the server rack is stored in a temperature-controlled environment such as a dedicated server room in order to ensure that the server equipment does not overheat during operation and is able to run at an optimal temperature. When environmental air is used to cool the servers by passing into the server rack, it is desirable to stably maintain the environmental air at a desirable temperature and to prevent any air exhausted from the server rack from increasing the server room temperature.

Various devices and techniques that attempt to manage the exhausted air while maintaining a desired server room temperature are known such as those found in patent literature PTL1-5 listed below. However, a more reliable, efficient, and cost saving device and technique are made possible by the server rack of the present invention as will be described later in detail.

CITATION LIST

Patent Literature

[Patent Literature 1]
Japanese Patent Publication H10-089780
[Patent Literature 2]
Japanese Patent 2009-104306
[Patent Literature 3]
Japanese Patent 2009-217500
[Patent Literature 4]
Japanese Patent 2011-123873
[Patent Literature 5]
Japanese Patent 2014-159923

DISCLOSURE OF INVENTION

Technical Problem

In order to efficiently cool the air to be exhausted from a server rack, it is necessary to know (or deduce) the temperature of the heated air. As shown in FIG. 1, a temperature sensor 115 can be employed to measure the exhaust air temperature of the server rack; however, there is a problem in that the exhaust air temperature of the server rack is not always homogeneous along the entire length of the rear side of server rack due to different components in different locations within the rack producing widely variant amounts of heat. Therefore, depending on the location of the temperature sensor, accuracy of the temperature measurement in terms of the aggregate exhaust air varies greatly, causing occasional overcooling or undercooling, and cooling efficiency is difficult to achieve and may be degraded as a result.

As shown in FIG. 2, using a plurality of temperature sensors at multiple locations along the rear side of the server rack to estimate the average temperature of the aggregate exhaust air may increase the accuracy of appropriate cooling. However, an increase in the number of sensors also increases cost and complicates the structure of the installation. Further, there is a time lag between temperature measurement and heat production which in turn delays cooling adjustment, in particular for rapidly changing server loads.

Solution to Problem

As a solution to the above mentioned problem, the present disclosure provides a server rack, a cooling method, and a machine learning estimator (hereinafter referred to as a "refrigerant parameter estimator") for modeling the cooling control of the server rack, all of which allowing for reliable and efficient cooling of server components while preventing an influence on the environmental air temperature.

As a first aspect of the present invention a server rack is provided which includes an air inlet configured to intake air from outside of the server rack; an air exhaust outlet configured to exhaust air to an outside of the server rack; an inlet temperature sensor configured to measure the temperature of inlet air; a heat exchanger provided at the air exhaust outlet of the server rack; a power consumption sensor provided to a power supply of the server rack and configured to measure electrical power consumption of the server rack; and a heat exchange controller configured to control heat exchange between the heat exchanger and the exhaust air based on measurements from the inlet temperature sensor and the power consumption sensor.

As a second aspect of the present invention, a control device for a server rack is provided which includes a processing unit; and an I/O unit configured to receive, via the processing unit, inlet air temperature measurement data and server rack power consumption measurement data and configured to output, via the processing unit, a heat exchange control parameter, wherein the processing unit determines the heat exchange control parameter based on the inlet air temperature measurement data and server rack power consumption measurement data.

As a third aspect of the present invention, a cooling method for a server rack is provided including the steps of: measuring an inlet air temperature of the server rack; measuring a power consumption of the server rack; determining a heat exchanger control parameter based on the inlet air temperature and the power consumption; and controlling the heat exchanger to remove heat from an exhaust air passing through the heat exchanger.

As a fourth aspect of the present invention, a non-transitory computer-readable medium is provided storing a program which causes a computer to execute the steps of: measuring an inlet air temperature of the server rack; measuring a power consumption of the server rack; determining a heat exchanger control parameter based on the inlet air temperature and the power consumption; and controlling the heat exchanger to remove heat from an exhaust air passing through the heat exchanger.

As a fifth aspect of the present invention, a refrigerant parameter estimator system is provided including: a data collector configured to receive power consumption measurement data of servers in a server rack, inlet air temperature measurement data of a server rack, and cooling ability data of a rear door heat exchanger from a refrigerant controller; a refrigerant parameter generator configured to generate a target refrigerant parameter from data received from the data collector, a refrigerant parameter model, a refrigerant parameter tuner and predefined key-value data, the target refrigerant parameter being used by the refrigerant controller to control cooling of the server rack; a refrigerant parameter model creator configured to generate the refrigerant parameter model using data stored in a historical data database and configured to send the refrigerant parameter model to the refrigerant parameter generator; and a refrigerant parameter tuner configured to generate a command for adjusting the target refrigerant parameter by using the power consumption measurement data and the cooling ability data received from the data collector, configured to send the command to the refrigerant parameter generator, and configured to store data in the historical data database.

Advantageous Effects of Invention

The present invention provides a cost-saving, reliable, and efficient server rack, method for cooling server components, or a refrigerant parameter estimator for modeling the cooling control of the server rack while preventing an influence on the environmental air temperature.

EMBODIMENTS FOR CARRYING OUT THE INVENTION

Figure 1:
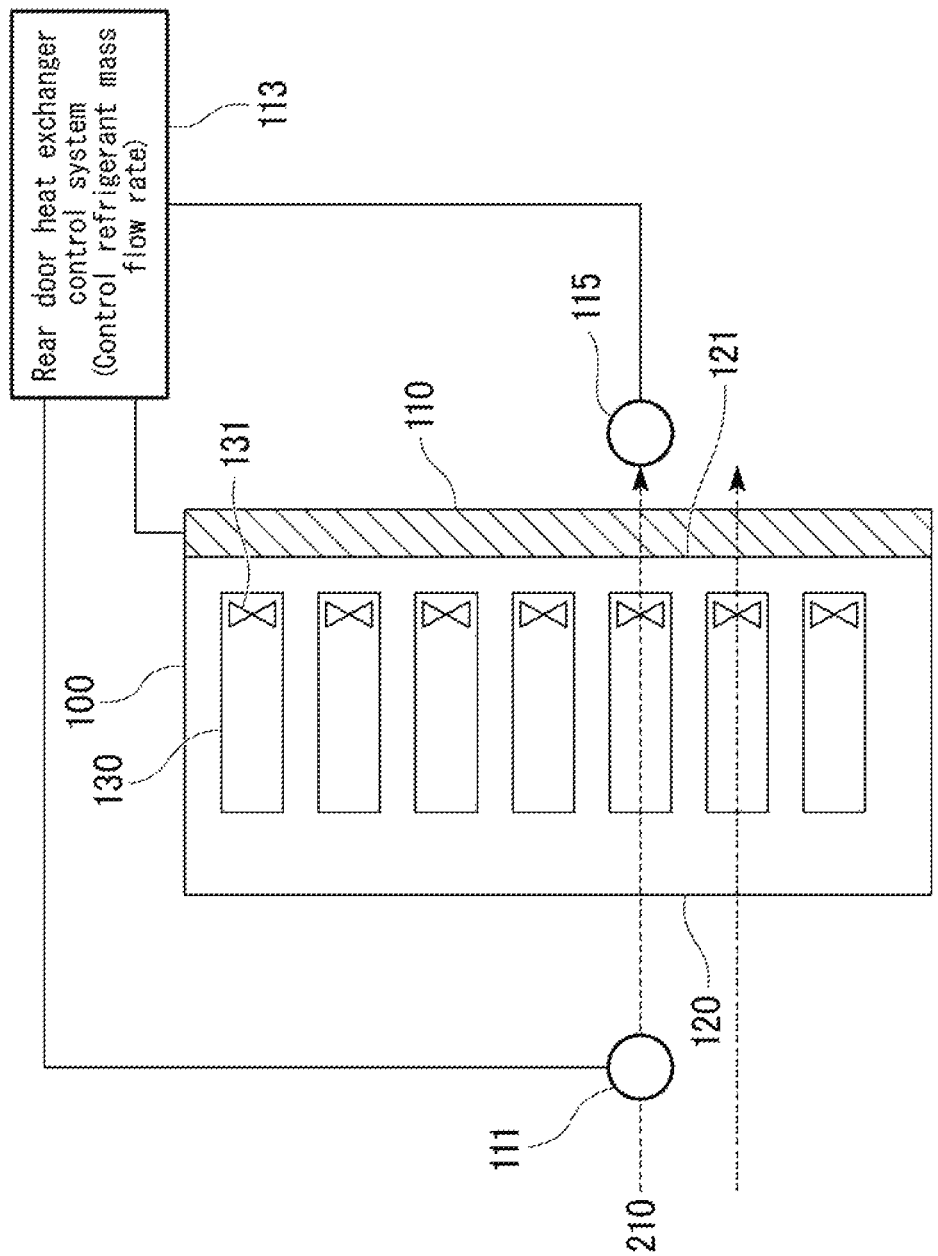
FIG. 1 is a schematic drawing of a cooling system for a server rack using an exhaust air temperature sensor.
Figure 2:
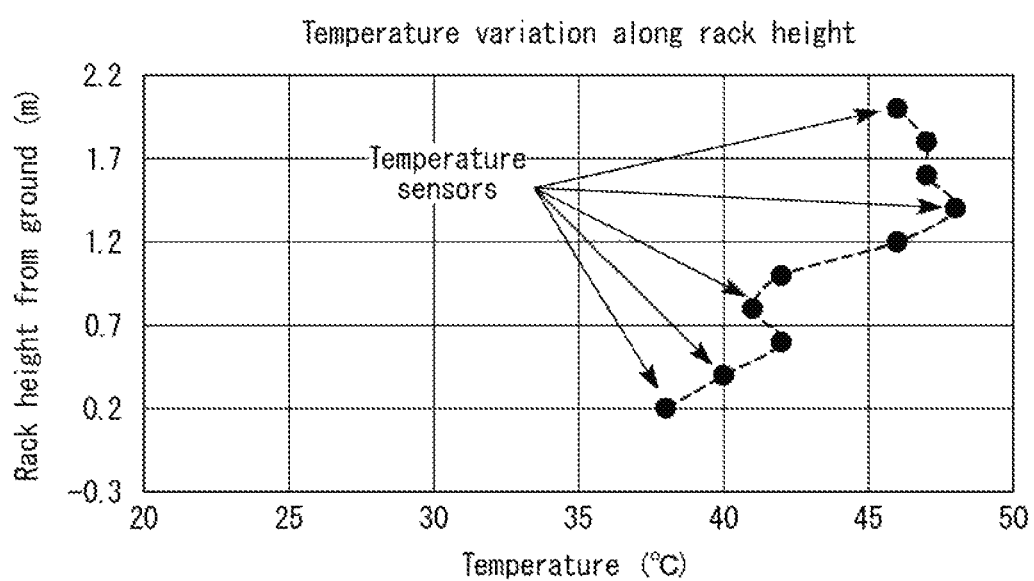
FIG. 2 is a chart showing an example of temperature measurements taken in a cooling system for a server rack where multiple exhaust outlet temperature sensors are used.

Exemplary embodiments of the present invention will be described below with reference to the drawings. In the drawings, the same elements are denoted by the same reference numerals, and thus redundant descriptions are omitted as needed.

Reference throughout this specification to "one embodiment", "an embodiment", "one example" or "an example" means that a particular feature, structure or characteristic described in connection with the embodiment or example is included in at least one embodiment of the present embodiments. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples.

First Exemplary Embodiment

Figure 3:
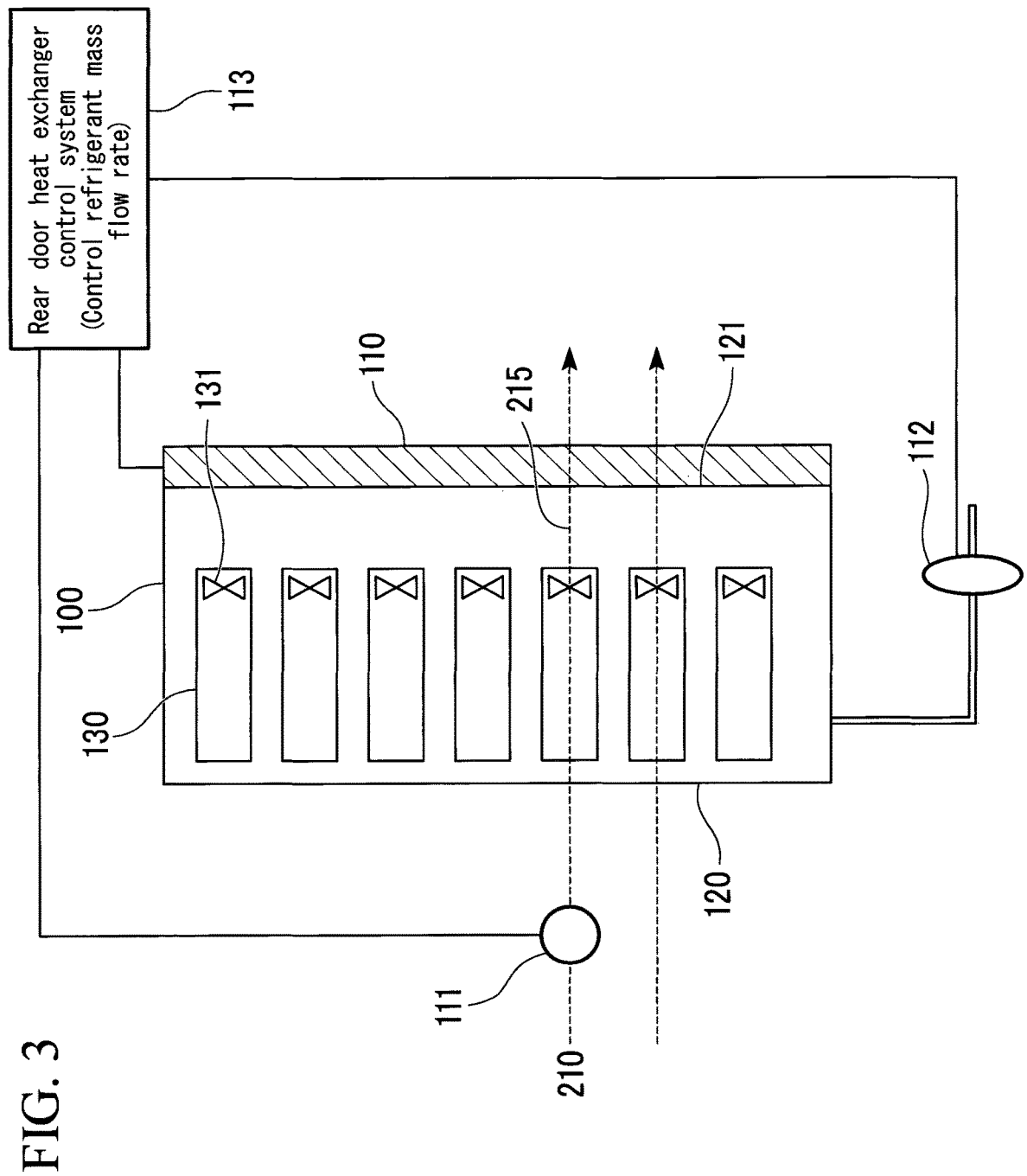
FIG. 3 is a schematic drawing of an embodiment of the cooling system for a server rack of the invention where only an inlet air temperature sensor and a power consumption sensor are used for the rack cooling control.

Here, a first exemplary embodiment of the present invention will be described with reference to FIG. 3 in terms of a server rack 100 which houses and cools, for example, servers, server components, and/or similar heat-generating computer devices (hereinafter simply referred to as "servers" 130).

In order to achieve the present invention and solve the aforementioned problems, the server rack 100 of the present invention includes an air inlet 120 through which environmental air from the outside of the server rack (hereinafter simply referred to as "inlet air" 210) is pulled into the server rack 100 by, for example, server fans 131 provided to individual servers 130 housed within the server rack 100. Inlet air 210 flowing into the server rack 100 cools the servers 130 and becomes heated thereby. This heated air (hereinafter referred to as "exhaust air") is then exhausted through a rear door heat exchanger (RDHx) 110 provided at an exhaust air outlet 121 of the server rack 100. The heat is removed from the exhaust air as it passes through the rear door heat exchanger 110 and ultimately returns to the environment surrounding rack.

In order for the environmental air temperature to remain unchanged and uninfluenced by the operation of the server rack, it is necessary that the aggregate air exhausted from server rack have the same temperature as the inlet air (i.e., the environmental air). Therefore, in the present exemplary embodiment, the rear door heat exchanger 110 is controlled via a control unit 113 (heat exchange controller) to increase/decrease a control parameter (also referred to as a "refrigerant parameter" or a "heat exchange control parameter") such that a specific amount of heat added by the operation of the servers 130 is removed from the exhaust air. The control parameter may be, for example, the temperature or the mass flow rate of a refrigerant used by the rear door heat exchanger 110 to cool the exhaust air.

The server rack 100 of the present exemplary embodiment includes an inlet air temperature sensor 111 to measure the temperature of the environmental air to be used as inlet air and a power consumption sensor 112 to measure the amount of power supplied to the servers 130 of the server rack 100 (hereinafter, the "power consumption of the server rack" refers to the power consumption of the servers of the server rack unless specified otherwise). Placement of the inlet air temperature sensor is not particularly limited to being directly within the inlet air flow path of the server rack 100 as long as it is reliably outside of the flow path of air exhausted from the rear door heat exchanger 110. The inlet air temperature and power consumption measurements are provided to the control unit 113 which determines the control parameter of the rear door heat exchanger 110 based on these measurements. Since the heat generated by the servers 130 is directly related to the power consumption of the server rack 100, the heat removal amount to be removed by the rear door heat exchanger 110 can be estimated at the time of heat generation (using only the power consumption sensor) and it is not necessary to wait for a temperature sensor located at the exhaust of the rear door heat exchanger 110 to detect an increase/decrease of exhausted air temperature (which becomes detectable only after a considerable delay due to the thermal inertia of the components) before adjusting the control parameter. In other words, it is possible to adjust the control parameter of the rear door heat exchanger 110 as soon as there is a change in power consumption (and thereby near-instantaneously with heat generation).

By using the inlet air temperature measurement in the determination of the control parameter of the rear door heat exchanger 110, the heat removal control becomes precisely in accordance with the change in the environmental temperature, and the heat exchange control becomes more efficient.

In this exemplary embodiment, the control unit 113 determines the control parameter by reference to a table. Examples of such a table are shown in the following Table 1 where the control parameter is the refrigerant mass flow rate and Table 2 where the control parameter is the refrigerant temperature.

TABLE 1

| Rack power consumption (kW) | Rack inlet air temperature (° C.) | Control parameter (Refrigerant mass flow rate, Kg/s) |
|---|---|---|
| 10 | 23 | 1.5 |
| 10 | 27 | 1.3 |
| 12 | 23 | 1.7 |
| 12 | 27 | 1.45 |

TABLE 2

| Rack power consumption (kW) | Rack inlet air temperature (° C.) | Control parameter (Refrigerant temperature, ° C.) |
|---|---|---|
| 10 | 23 | 20 |
| 10 | 27 | 24 |
| 12 | 23 | 19 |
| 12 | 27 | 22 |

The values of the table may be appropriately set in advance in accordance with theory or experimentation. A brief description of an example of setting the table in accordance with experimentation will be explained here. Assuming that such experimentation is performed in a constant environment, such as a server room, with negligible interference from external factors, the server rack is run with a selected power consumption and selected control parameter for a period of time sufficient for the environmental temperature at the inlet sensor to stabilize and remain constant. At that time, those values are recorded into the table and the process is repeated until the table includes a range of power consumption, control parameter, and temperature values recorded in the table. After the table is set by such experimentation, the server rack 100 may operate normally making reference to the table to control the rear door heat exchanger 110.

The control unit 113 of this exemplary embodiment will be described functionally and it is to be understood by persons skilled in the art that the control unit 113 may be implemented by dedicated hardware or by software instructions used to cause a computer to control the rear door heat exchanger 110. The control unit 113 receives measurements from the inlet temperature sensor 111 and the power consumption sensor 112, and based on these measurements (in this exemplary embodiment, by referring to the table), sends a control signal to control the rear door heat exchanger 110 in accordance with the determined control parameter.

Second Exemplary Embodiment

Here, a second exemplary embodiment of the present invention will be described with reference to FIG. 3 in terms of a server rack 100 with a similar configuration to that of the first exemplary embodiment except that instead of determining the control parameter of the rear door heat exchanger 110 by reference to a table, a mathematical formula is used to calculate the control parameter.

In the following equation:

$$Q\_rdhx = P\_in = C_0 + C_1 \times T\_in\_rack + C_2 \times m\_air\_in\_rack + C_3 \times m\_ref\_rdhx + C_4 \times T\_in\_ref\_rdhx \quad \text{[Math 1]}$$

Q_rdhx is the thermal energy (kW) to be extracted by the rear door heat exchanger; P_in is the power consumption of the servers (kW); T_in_rack is the inlet air temperature (° C.); m_air_in_rack is the rack inlet air mass flow (kg/s); m_ref_rdhx is the mass flow rate of the refrigerant of the rear door heat exchanger (kg/s); and T_in_ref_rdhx is the temperature of the refrigerant of the rear door heat exchanger (° C.). $C_0$, $C_1$, $C_2$, $C_3$, and $C_4$ are constants which may be determined in advance according to theoretical estimation using known specifications of the servers 130 and the rear door heat exchanger 110.

More specifically, the theoretical estimation of constants $C_0$, $C_1$, $C_2$, $C_3$, and $C_4$ can be calculated from follows. The server air flow rate is a predefined function $F_1(x)$ of the server power (obtained from, for example, a data sheet provided by the server manufacturer). The rack inlet air mass flow can thereby be obtained by the following equations.

$$m\_air\_in\_rack = density\_air * total\_server\_airflow$$

$$total\_server\_airflow = F_1(P\_in) \quad \text{[Math 2]}$$

where, density_air is the density of air (kg/m³). The average temperature of exhaust air from the servers 130 can be calculated from:

$$T\_in\_rdhx = T\_in\_rack + (P\_in/(m\_air\_in\_rack * CP)) \quad \text{[Math 3]}$$

where, T_in_rdhx is the average temperature of the exhaust air flowing into the rear door heat exchanger, and CP is the air specific heat (kJ/kg·K). The rear door heat exchanging capacity is (as provided in, for example, a manufacturer data sheet) a predefined multi-variable function $F_2(w, x, y, z)$ of the temperature of the refrigerant of the rear door heat exchanger, the average temperature of the exhaust air flowing into the rear door heat exchanger, the mass flow rate of the refrigerant of the rear door heat exchanger, and the rack inlet air mass flow, which can be used to obtain the following relationship.

$$P\_in = Q\_rdhx = F_2(T\_in\_ref\_rdhx, T\_in\_rdhx, m\_ref\_rdhx, m\_air\_in\_rack) \quad [\text{Math 4}]$$

Using the above equations, the linear regression constants $C_0$, $C_1$, $C_2$, $C_3$, and $C_4$ that fit the equation can be determined. Then, the control parameter can be determined through the linear regression equation. It should be noted that depending on the control parameter of the rear door heat exchanger (i.e., refrigerant mass flow rate or refrigerant temperature) one of $C_3$ and $C_4$ should be zero.

An experimental determination of $C_0$, $C_1$, $C_2$, $C_3$, and $C_4$ can also be performed under similar experimental conditions as those described in the first exemplary embodiment. First, a rack power consumption level (P_in) is selected and a control parameter value is selected (i.e., refrigerant mass flow rate or refrigerant temperature). After running at a steady state for a period of time such that the environmental air temperature stabilizes, the air inlet temperature is recorded into memory, and the process is repeated until a number of data points are obtained at various rack power consumption levels and various control parameters. After a sufficient amount of data is obtained, a fitting method such as linear regression can be performed to obtain the values of $C_0$, $C_1$, $C_2$, $C_3$, and $C_4$.

Third Exemplary Embodiment

Figure 4:
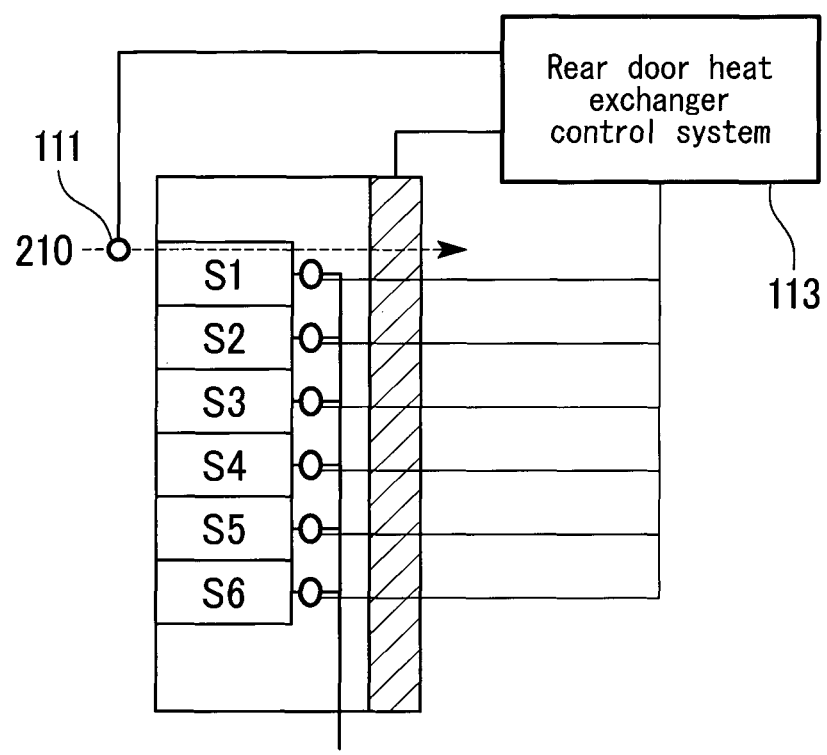
FIG. 4 is a schematic drawing of a cooling system for a server rack where power consumption is measured at each heat generating server component.

A third exemplary embodiment of the present invention will be described with reference to FIG. 5. In the first and second exemplary embodiments, a power consumption sensor 112 measures the power consumption of the servers 130 of the server rack 100; however, in the present embodiment, a plurality of power consumption sensors 112 are used as shown in FIG. 4. Here, each server is connected to a power consumption sensor 112. As can be seen in Table 3, in order to achieve a particular rack inlet air temperature, different values for the refrigerant control parameter may be required even for the same total rack power consumption (but different server power variation inside rack). Table 3 can be obtained by similar experimental procedures as those described for Table 2 in the first exemplary embodiment.

eter. With consideration of server power distribution, improved control over the control of the rack inlet air temperature can be achieved.

Figure 5:
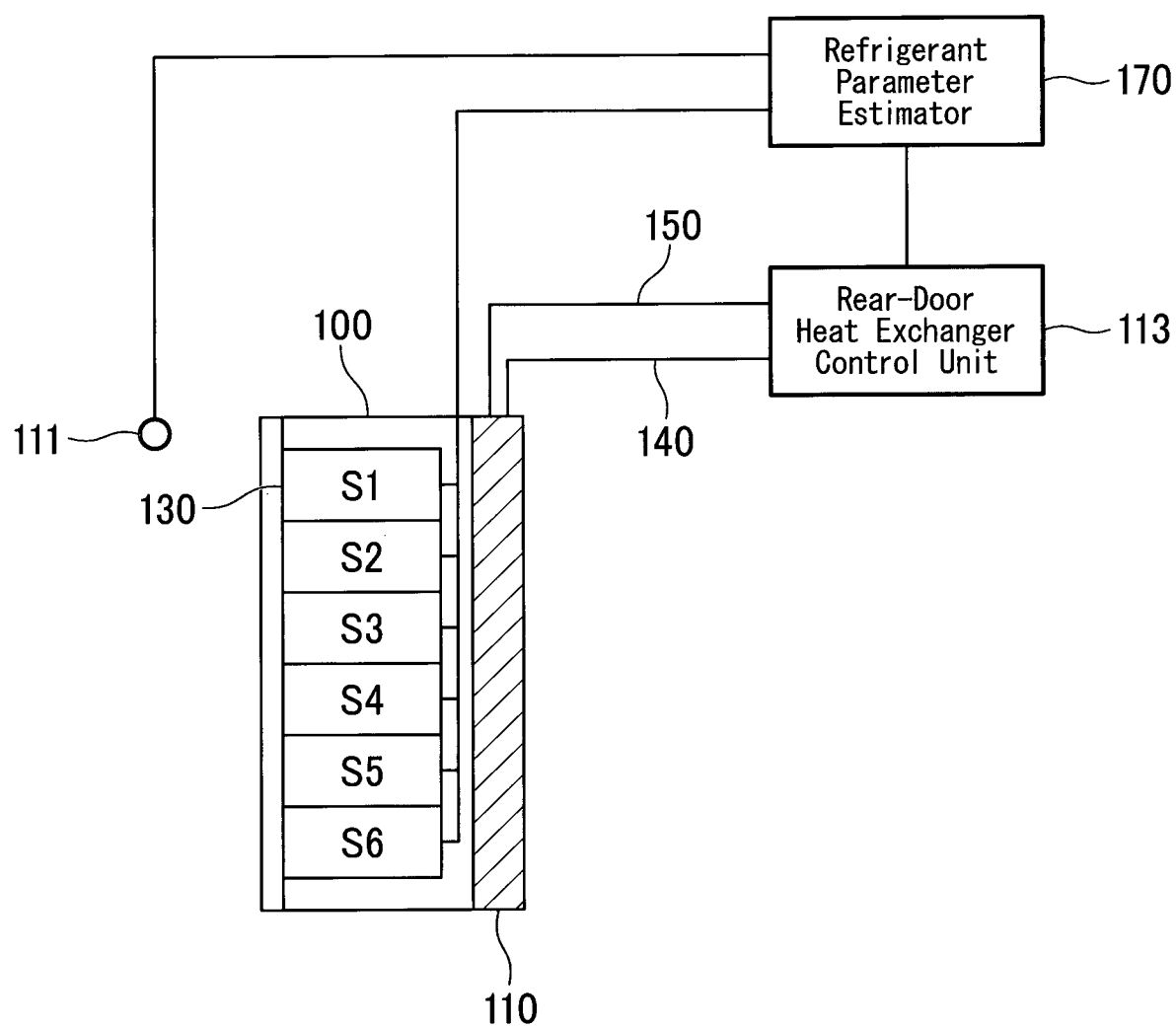
FIG. 5 is a schematic drawing of a cooling system for a server rack where a refrigerant parameter estimator determines a refrigerant parameter model for a rear door heat exchange controller.

With reference to FIG. 5 as an example, the rear door heat exchanger 110 may receive the liquid refrigerant from the supply pipe 140 and return the evaporated refrigerant through the return pipe 150. The rear door heat exchanger 130 receives the exhaust heat from the servers 130 and heat transfers to the liquid refrigerant supplied by the supply pipe 140. The liquid refrigerant absorbs the exhaust heat and evaporates into gas which is carried out from the rear door heat exchanger 110 via the return pipe 150. As another example, the rear door heat exchanger 110 may receive chilled water from the supply pipe 140. In such case, the chilled water absorbs the exhausted heat of the servers and becomes hot, and the hot water is carried away from rear door heat exchanger 130 using the return pipe 150. Generally, the state of matter of the refrigerant (i.e., liquid or gas) is not particularly limited for use in the supply pipe 140 or the return pipe 150.

Instead of using experimental data for obtaining the variably distributed power consumption control scheme of Table 3, the present exemplary embodiment utilizes an automated machine-learning based algorithm to determine a machine learned refrigerant parameter model to be employed by the control unit 113. Implementing a machine-learned model (herein after referred to as a "refrigerant parameter model") can reduce the amount of time that would be required for performing experimentation.

As shown in FIG. 5, a refrigerant parameter estimator 170 receives and stores inlet air temperature measurement data and server power consumption data respectively from the inlet air temperature sensor 111 and the plurality of power consumption sensors 112 of the server rack 100 and communicates with the rear door heat exchanger control unit 113. The refrigerant parameter estimator 170 is a machine learning device which creates, updates, and sends a refrigerant parameter model to the control unit 113 of the server rack 100 and receives and stores refrigerant control parameter data from the control unit 113. The refrigerant parameter estimator 170 produces the refrigerant parameter model based on current and historical temperature measurement data, server power consumption data, and refrigerant control

TABLE 3

| Data No. | S1 (kW) | S2 (kW) | S3 (kW) | S4 (kW) | S5 (kW) | S6 (kW) | Total Rack Power (kW) | Control parameter (Refrigerant temperature, ° C.) | Rack inlet air temperature, ° C. |
|---|---|---|---|---|---|---|---|---|---|
| 1 | 1.5 | 1.5 | 1.5 | 1.5 | 1.5 | 1.5 | 9 | 20.5 | 23 |
| 2 | 1.5 | 1.5 | 1.5 | 1.5 | 1 | 1 | 8 | 21 | 23 |
| 3 | 1.5 | 1.5 | 1 | 1 | 1 | 1 | 7 | 21.6 | 23 |
| 4 | 2 | 2 | 2 | 2 | 0 | 0 | 8 | 20.5 | 23 |
| 5 | 4 | 4 | 0 | 0 | 0 | 0 | 8 | 19 | 23 |

One advantage of using server power distribution inside the rack instead of the total rack power consumption is reflected in terms of improved control of the target parameter of the rear door heat exchanger (RDHx) 110. Such improved control can be understood from data items No. 2, 4, and 5. In each data row, the total rack power remains the same (i.e., 8 kW); however, to achieve 23° C., the control parameter (e.g., refrigerant temperature) is different in each case, 21° C., 20.5° C., and 19° C. This clearly shows that server power distribution can also affect the control paramparameter data. The control unit 113 receives the refrigerant parameter model from the refrigerant parameter estimator 170 and stores the refrigerant parameter model in memory. Based on the current inlet air temperature measurement and the current power consumption measurements of the servers 130, the control unit 113 determines the refrigerant control parameter according to the stored refrigerant parameter model and controls the refrigerant (in terms of flow rate or temperature) supplied to the rear door heat exchanger 110.

Figure 6:
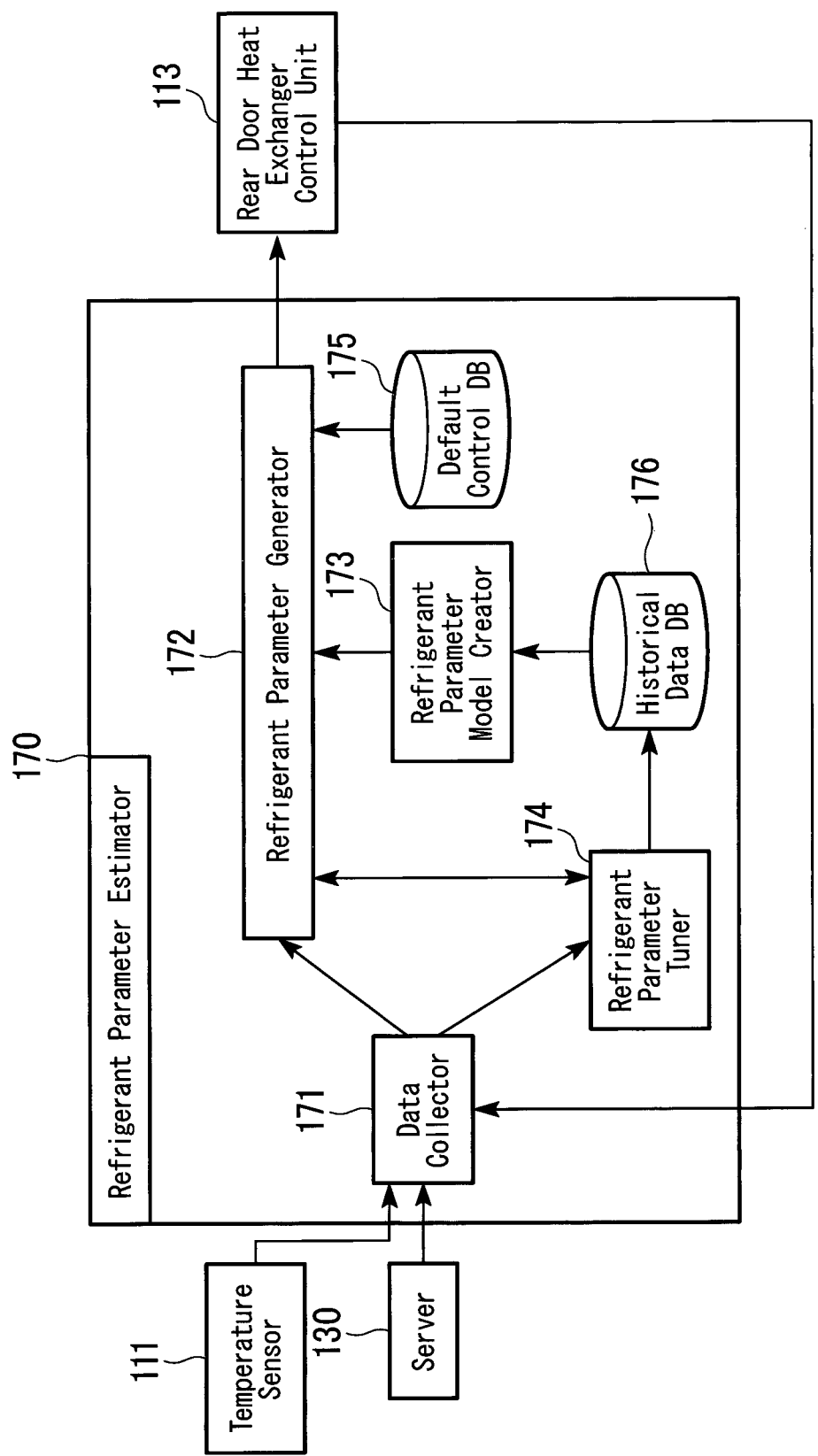
FIG. 6 is a block diagram of a refrigerant parameter estimator of a cooling system for a server rack.

Hereinafter, the refrigerant parameter estimator 170 will be described with reference to FIG. 6. FIG. 6 is a block diagram illustrating an outline of the refrigerant parameter estimator 170 which includes four functional modules and two databases; the data collector 171, the refrigerator parameter generator 172 (also referred to as "the generator 172"), the refrigerant parameter model creator 173 (also referred to as the "model creator 173"), the refrigerant parameter tuner 174 (also referred to as "the tuner 174"), the default control database 175, and the historical data database 176.

The data collector 171 collects and processes the necessary data for estimating the refrigerant control parameter. The data collector 171 obtains the cooling ability of the rear door heat exchanger 110 from the controller 113, collects the power consumption data from the servers 130 and calculates the rack power from:

$$Q_{rack} = \Sigma_{i \in S} Q_S^i \quad \text{[Math 5]}$$

where $Q_{rack}$ is the rack power, $|Q_S^i|$ rack is the power of server i, and S is the plurality of servers 130 in the server rack 100. The data collector also collects inlet air temperature measurements from the inlet air temperature sensor 111. The data collector 171 passes the collected and calculated $Q_{rack}$, rack inlet air temperature measurement, and the RDHx cooling ability to the generator 172 and the tuner 174 for further processing.

The generator 172 produces the target refrigerant control parameter and sends it to the control unit 113. The generator 172 finds the target refrigerant control parameter which removes all of the exhaust heat in the rack 110 based on the power and temperature data from the data collector 172. The generator 172 selects the method for finding the target refrigerant control parameter depending on the number (N) of data sets in the historical data database 176 obtained from the model creator 173. At the initiation, the number (N) of historical data sets may not be sufficient to make an accurate model. If the number (N) of data set is greater than the number defined in the configuration, the generator 172 calculates the refrigerant control parameter from the refrigerant parameter model received from the model creator 173. Otherwise, the generator 172 calculates the rack power consumption from the respective server power consumption measurements and selects the refrigerant control parameter from a key-value database stored in the default control database 175. The tuner 174 sends the generator 172 a request for the current target refrigerant control parameter and the command to increase or decrease the target refrigerant control parameter depending on the inputs from the data collector 171. Then, the generator 172 returns the latest refrigerant control parameter which it sends to the control unit 113 as well as to the tuner 174. If the target refrigerant control parameter change request is sent by the tuner 174, the generator 172 adjusts the target refrigerant control parameter following that command and sends a new target refrigerant control parameter to the control unit 113 as well as to the tuner 174.

The default control database 175 is a pre-defined key-value database where the key is rack-scale power and the value is the target refrigerant control parameter as shown in Table 4 below. For example, the first line shows that when the rack-scale power is 4 kW, the target refrigerant control parameter is 22.5° C. for 23° C. desired rack inlet air temperature.

TABLE 4

| Rack power (kW) | Control parameter (Refrigerant temperature, ° C.) | Rack inlet air temperature (° C.) |
|---|---|---|
| 4 | 22.5 | 23 |
| 8 | 21 | 23 |
| 12 | 19 | 23 |
| 16 | 16.5 | 23 |
| 20 | 13.8 | 23 |

The model creator 173 generates the refrigerant parameter model utilizing the historical data in the historical data database 176 as the input and gives the refrigerant parameter model as the output to the generator 172. A decision tree regression algorithm (DTR) in scikit-learn library, for example, which is standard machine learning library in Python, is applied in order to make the refrigerant parameter model. DTR creates and trains the model with non-linear mapping of the power consumption of the servers in the rack and the rack inlet air temperature to the optimal refrigerant control parameter. Therefore, DTR attempts to generate the non-linear refrigerant parameter model as the following function:

$$f_{model}: [Q^s_1, Q^s_2, \ldots Q^s_s, T_{rack\_air\_inlet}] \to T_{ref}$$

where $Q_S^i$ is the power of server i, S is the number of servers in the rack, $T_{rack\_air\_inlet}$ is the inlet air temperature and $T_{ref}$ is the target refrigerant control parameter. The model creator 173 also gives the number of data sets in the historical data database 176 upon the request from the generator 172.

The data sets in the historical data database 176 is utilized as the training data in DTR. The historical data database 176 contains the past data set of each server power in the rack and the optimal refrigerant control parameter for a desired inlet air temperature which extracts all of heat dissipated in the rack as illustrated in Table 5. For instance, the first row shows that if each server consumes 1.5 kW, the optimal refrigerant control parameter is 20.5° C. for a target inlet air temperature of 23° C.

TABLE 5

| Data No. | S1 (kW) | S2 (kW) | S3 (kW) | S4 (kW) | S5 (kW) | S6 (kW) | Total Rack Power (kW) | Control parameter (Refrigerant temperature, ° C.) | Rack inlet air temperature, ° C. | Heat removed by heat exchanger for Tref = 21° C. (kW) |
|---|---|---|---|---|---|---|---|---|---|---|
| 1 | 1.5 | 1.5 | 1.5 | 1.5 | 1 | 1 | 8 | 21 | 23 | 8 |
| 2 | 2 | 2 | 2 | 2 | 0 | 0 | 8 | 20.5 | 23 | 7.6 |
| 3 | 4 | 4 | 0 | 0 | 0 | 0 | 8 | 19 | 23 | 7 |

The tuner 174 examines whether the rear door heat exchanger 110 has removed all of the heat dissipated in the rack and compares the power consumption data of the servers 130 and the cooling ability of the rear door heat exchanger 110 from the data collector 171. In the case that the rear door heat exchanger 110 cannot achieve total heat extraction, the tuner 174 sends a command to adjust the refrigerant control parameter to the generator 172. Otherwise, the tuner 174 obtains the current target refrigerant control parameter from the generator 172 and stores the server power consumption data set, the inlet air temperature and the refrigerant control parameter in the historical data database 176 for further modeling.

Figure 8:
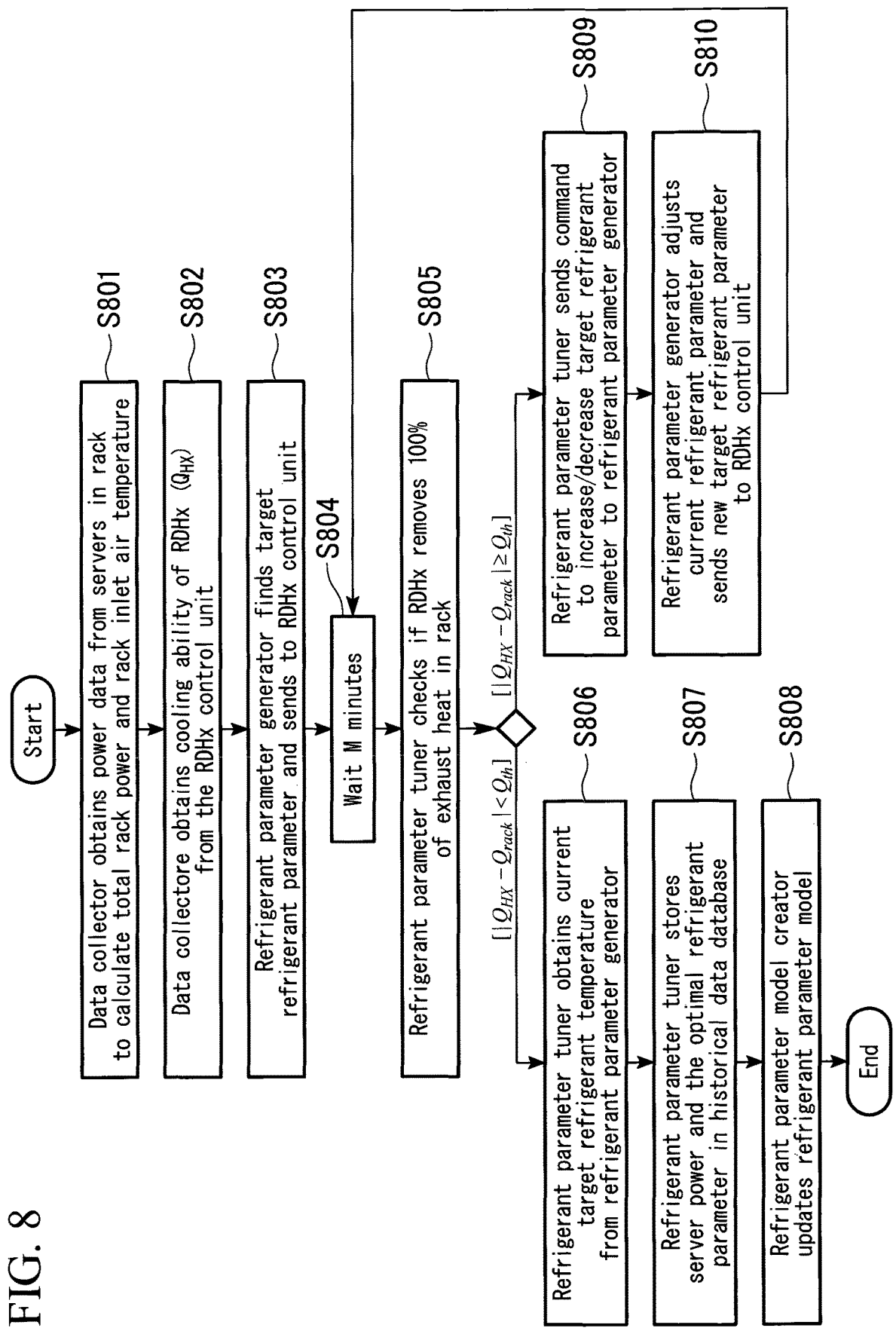
FIG. 8 is a flow chart showing the operations of an embodiment of a refrigerant parameter estimator of the present invention.

Here, the workflow of the refrigerant parameter estimator 170 will be described with reference to FIG. 8.

In Step S801, the data collector 171 obtains the power consumption data from each server 130 in the server rack 100. Power consumption data of the servers can be obtained from an MIB (management information base) using a SNMP (Simple Network Management) protocol. Then, the data collector 171 calculates the rack power of the server rack 100 by summing all server power consumption measurements. For example, in data set No. 2 in Table 3, the set of server power ($Q_s$) in the server rack 100 is {1500, 1500, 1500, 1500, 1000, 1000} W, then the rack power ($Q_{rack}$) is 8000 W. Each server's power consumption data will be passed to the generator 172 and rack-scale power will be passed to the tuner 174 for further processing. In addition to the server power, the inlet air temperature ($T_{rack\_air\_inlet}$) is obtained from the inlet air temperature sensor 111 and passed to the generator 172.

In Step S802, the data collector 171 sends the request to the control unit 113 and obtains the amount of cooling ability of the rear door heat exchanger 110 ($Q_{HX}$). This data is then passed to the tuner 174 for further processing.

In Step S803, the generator 172 finds the target refrigerant control parameter either from the refrigerant parameter model or from the default control database 175 based on each server's power consumption data and rack inlet air temperature received in Step S801. Then, the generator 172 sends the target refrigerant control parameter to the control unit 170. The workflow of the generator 172 in this step will be explained later in more detail.

In Step S804, after the control unit 170 receives the target refrigerant control parameter from the generator 172, the control unit 113 gradually changes the refrigerant control parameter of the rear door heat exchanger 110. The refrigerant parameter estimator waits for M=5 minutes or any other predetermined value until the thermal environment become stable.

In Step S805, after M minutes, the tuner 174 examines if the rear door heat exchanger 110 has removed all of the exhaust heat in the server rack 100. The tuner 174 compares the absolute difference value between $Q_{HX}$ and $Q_{rack}$ ($|Q_{HX}-Q_{rack}|$) with a threshold value $Q_{th}$ which is a predefined value in the system.

In Step S806, if $|Q_{HX}-Q_{rack}|<Q_{th}$ meaning that the rear door heat exchanger 110 is able to remove all of the exhaust heat in the server rack 100. The tuner 174 requests and obtains the current target refrigerant control parameter from the generator 172 and count this value as the optimal refrigerant control parameter for this set of server power consumption and inlet air temperature data. For example, in Table 5, data set No. 1 shows that $Q_{HX}=Q_{rack}=8$ kW. The tuner 174 will obtain 21° C. as the optimal refrigerant control parameter from the generator 172.

In Step S807, the tuner 174 stores the set of server power consumption, inlet air temperature measurement, and the optimal refrigerant control parameter in the historical data database 176. For data set No. 1 in Table 5, the tuner 174 adds {1500, 1500, 1500, 1500, 1000, 1000, 23, 21} in the historical data database 176.

In Step S808, the model creator 173 updates the refrigerant parameter model. DTR recreates and trains the model with updated data in the historical data database 176. The model creator 173 utilizes all data in the historical data database 176 and newly added data from Step S807 for modeling. Therefore, the training data now includes, for example, {1500, 1500, 1500, 1500, 1000, 1000, 23, 21} in the data storage format of [$Q^s_1, Q^s_2, \ldots Q^s_s, T_{rack\_air\_inlet}, T_{ref}$]. Then, the model creator 173 generates the non-linear refrigerant parameter model as the following function:

$$f_{model}:[Q^s_1, Q^s_2, \ldots Q^s_s, T_{rack\_air\_inlet}] \rightarrow T_{ref}$$

In Step S809, if, $|Q_{HX}-Q_{rack}| \geq Q_{th}$ meaning that the rear door heat exchanger 110 cannot remove all of the exhaust heat in the rack 110, the tuner 174 sends a command to increase or decrease the target refrigerant control parameter to the generator 172. As an example, in data set No. 2 in Table 5, $Q_{HX}$ is less than $Q_{rack}$. This happened primarily due to the fact that the 21° C. set point of refrigerant control parameter cannot achieve the desired rack inlet air temperature of 23° C. due to concentrated server power distribution, and a far lower refrigerant control parameter is required to achieve the desired rack inlet air temperature of 23° C. The tuner 174 sends a command to decrease the target refrigerant control parameter to the generator 172. In a case where $Q_{HX}$ is greater than $Q_{rack}$, the tuner 174 sends a command to increase the target refrigerant control parameter to the generator 172.

In Step S810, after the generator 172 receives a command from the tuner 174, the generator 174 adjusts the target refrigerant control parameter following that command. For example, if the current refrigerant control parameter is 21° C., when the generator 162 receives the decrease command from the tuner 174, the generator 172 changes the target refrigerant control parameter to 20.5° C. Then, the generator 172 sends the new target refrigerant control parameter to the control unit 113 and repeats Step S804.

Figure 9:
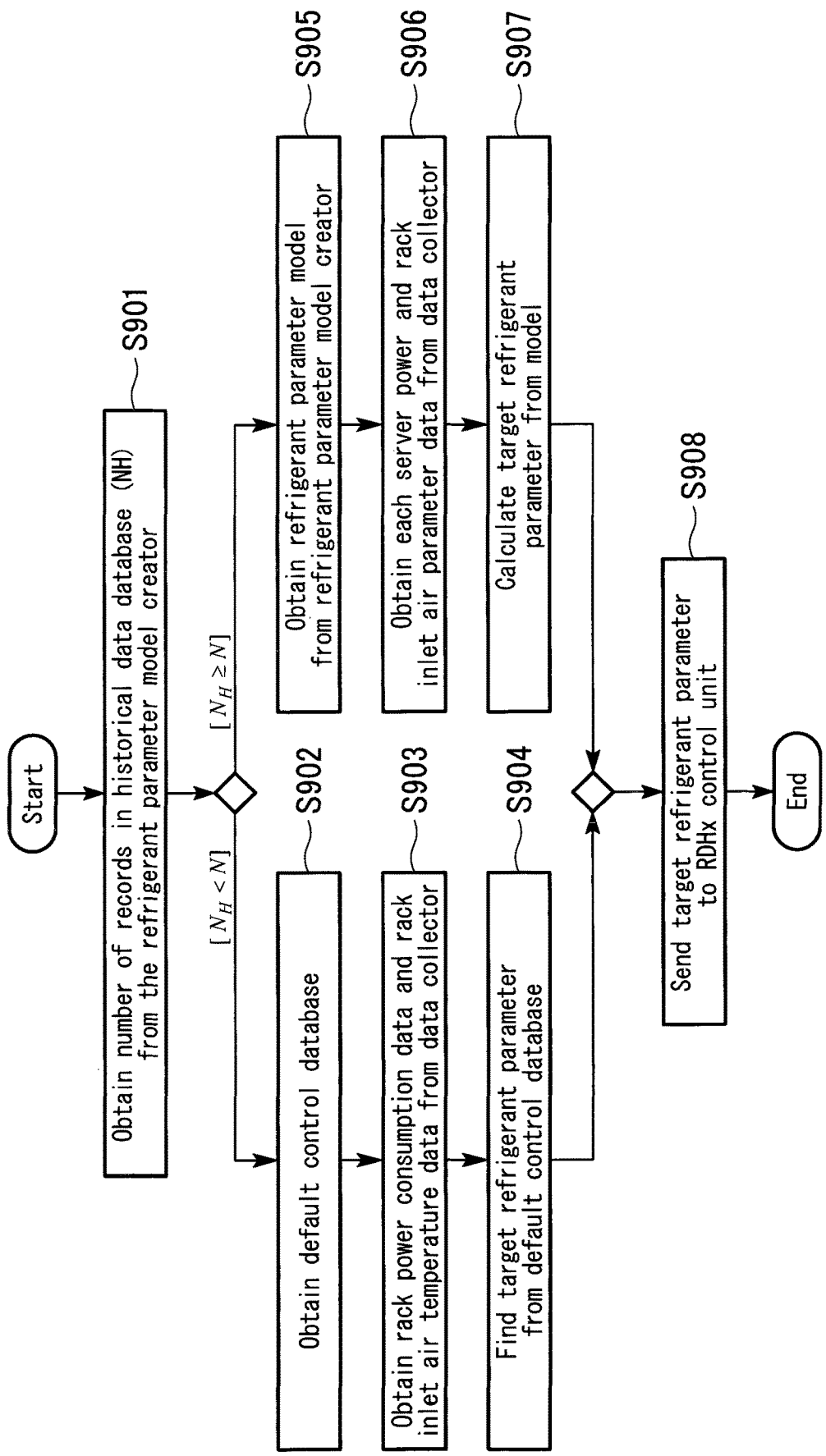
FIG. 9 is a flow chart showing the operations of an embodiment of a refrigerant parameter estimator of the present invention.

Here, a detailed description of the workflow for generating the target refrigerant control parameter by the generator 172 in Step S803 will be given with reference to FIG. 9.

In Step S901, at the initiation, the number of historical data may not be sufficient to make an accurate model. The generator 172, therefore, obtains the number ($N_H$) of data sets in the historical data database 176 to check if it is enough for modeling. The generator 172 compares $N_H$ with the number defined in the configuration (N).

In Step S902, if $N_H$ is less than N, the generator 172 obtains the default control data from the default control database 175 as shown in Table 4. The default control data is a key-value pair of rack power and the target refrigerant control parameter that is predefined.

In Step S903, the generator 172 obtains the rack power consumption and the inlet air temperature measurement from the data collector 171. As an example in data set No. 1 of Table 4, the rack power obtained from the data collector 171 is 4 kW and the desired inlet air temperature is 23° C.

In Step S904, the generator 172 finds the target refrigerant control parameter from the default control data. The generator 172 finds the key that is equal to the rack power consumption and gets the value of that key as the target temperature. If there is no key similar to the rack power, the generator 172 selects the target temperature from the key that has the closest value to the rack power consumption. For example, if the rack power is 4 kW, the generator selects 22.5° C. as the target refrigerant control parameter.

In Step S905, in another case where $N_H$ is greater than N, the generator 172 obtains the refrigerant parameter model ($f_{model}$) from the model creator 173. In Step S906, the generator 172 obtains the power consumption data of each server from the data collector 171. As an example in data set No. 1 of Table 5, the power consumption data obtained from the data collector 171 is {1500, 1500, 1500, 1500, 1000, 1000}.

In Step S907, the generator 172 calculates the target refrigerant control parameter from the model received in Step S906 utilizing each server power as the input for the model. Using the example server power in Step S906, the generator 172 can calculate the target refrigerant control parameter as follows:

$$f_{model}: [1500,1500,1500,1500,1000,1000,23] \rightarrow 21$$

In Step S908, the generator 172 sends the target refrigerant control parameter to the control unit 113.

Fourth Exemplary Embodiment

Figure 7:
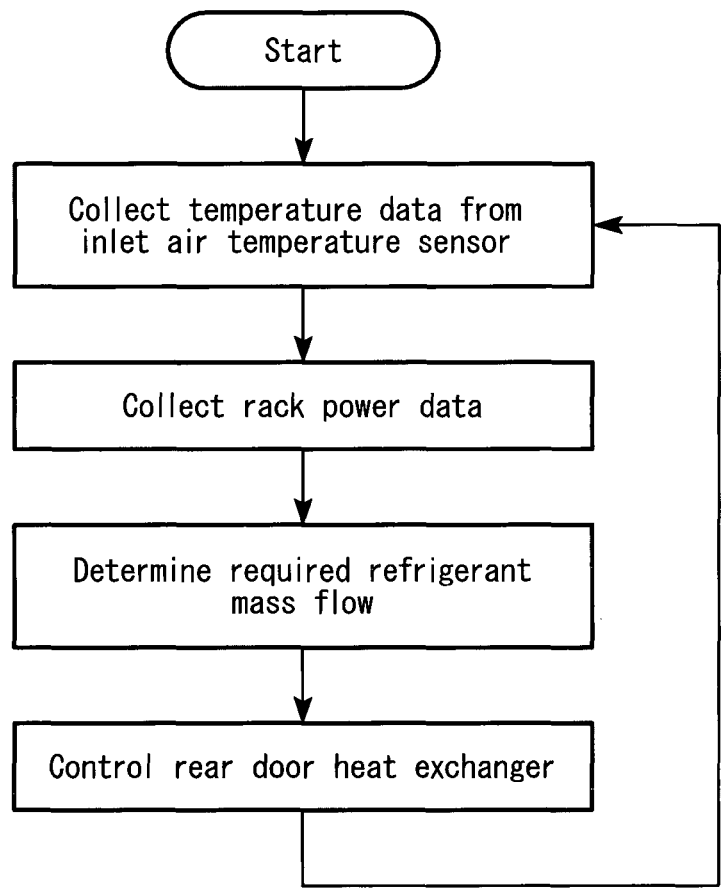
FIG. 7 is a flow chart showing the operations of an embodiment of the present invention.
Figure 10:
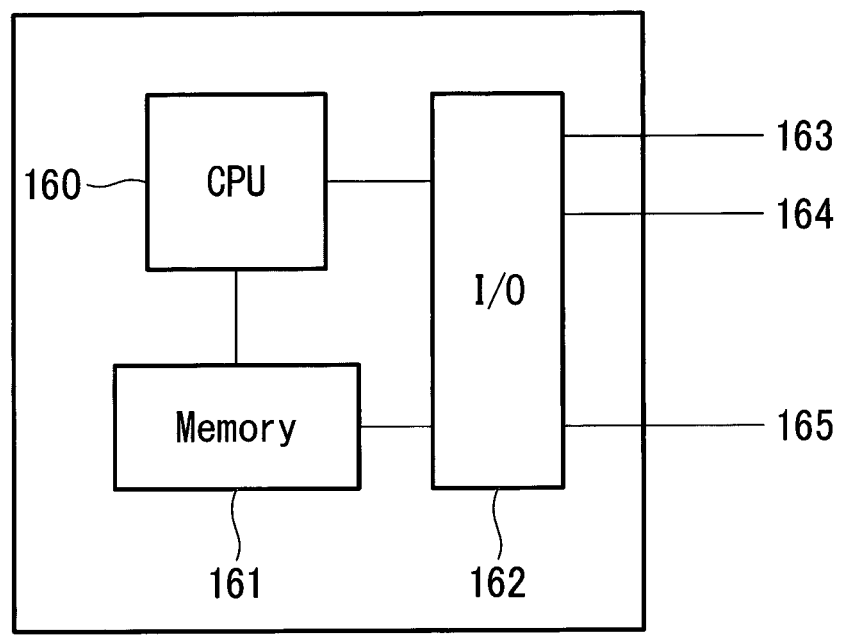
FIG. 10 is a functional diagram of an embodiment of a control device for a server rack of the present invention.

A fourth exemplary embodiment of the present invention will be described with reference to FIG. 10. The control device of the present exemplary embodiment has a central processing unit 160 to process instructions and to access both memory 161 and an I/O unit 162 that receives temperature data input 163 and power consumption data input 164. The I/O unit 162 outputs a control signal 165 which is a control parameter of a heat exchanger to increase/decrease at least one of the refrigerant mass flow rate or the temperature of the refrigerant. The control device may determine the control parameter by way of a table in a similar manner as that described in the first exemplary embodiment or by a formula in a similar manner as that described in the second exemplary embodiment, and may operate in accordance with the operation flow chart shown in FIG. 7.

Above, three exemplary embodiments of the present invention have been described. It should be recognizable to a person skilled in the art that these exemplary embodiments are merely examples of specific implementations of the invention and the invention should not be considered as limited only to these implementations. For example, the structural configuration of the rear door heat exchanger is not particularly limited as long as it is able to carry out the function of removing heat from air exhausted from the air exhaust outlet 121 of the server rack. The rear door heat exchanger may use a refrigerant storage tank and/or a compressor, a pump, or the like to circulate or disperse refrigerant, and such components of the rear door heat exchanger may be located inside the server rack housing, external of the server rack housing, or even outside of the server room (for example, refrigerant may be flowed into and out of the server room and into and out of the server rack via tubes, pipes, or the like).

A hardware implementation of the control device and the refrigerant parameter estimator 170 are described above, and the placement of the control device (control unit 110) and the refrigerant parameter estimator 170 is not particularly limited and may be located anywhere within (or even externally to) the server rack 100 or, for example, integrally formed into the rear door heat exchanger 110. Furthermore, the control device or the refrigerant parameter estimator 170 may be implemented with, for example, a microcontroller, a programmable logic chip, or the like, integrated into another electronic device which shares like components or functionally implemented in software on a general purpose computer.

Since the control unit 113 and refrigerant parameter estimator 170 are likely to have greatly different processing capacity requirements, practical implementation may require consideration of hardware costs. In view of this, the refrigerant parameter estimator 170 may preferably be external to the rack and capable of communicating with the control unit 113 over a network, the Internet, or the like, and may even be connected to a plurality of server racks so as to create, update, and send refrigerant parameter models to the control unit 113 of respective server racks 100. In such case, the refrigerant estimator 170 may receive the inlet air temperature measurement data, the power consumption measurement data, rear door heat exchange parameter data for the respective server racks 100 via communication with the respective control units 113. Depending upon design requirements, the refrigerant parameter estimator 170 may discontinue communication with the control unit 113 at such time that the refrigerant parameter model is able to sufficiently perform without further need of updating the model. It is also possible for the refrigerant parameter estimator 170 to simply send the heat exchanger control parameter based on the refrigerant parameter model to the control unit instead of sending the refrigerant parameter model.

In the third embodiment, the machine learning algorithm used for modeling the refrigerant parameter is DTR; however, the algorithm is not limited to DTR. Other supervised machine learning algorithms can also be applied. For example, artificial neural network In the above described exemplary embodiments, the power consumption and heat generation of the rear door heat exchanger itself are not specifically considered in the determination of the control parameter, however, depending on the specific configuration of the rear door heat exchanger, consideration may be made in accordance with design specifications or as necessary.

Furthermore, embodiments in accordance with the present exemplary embodiments may be implemented as an apparatus, a device, a method, or a computer program product. Accordingly, the present exemplary embodiments may take the form of an entirely hardware embodiment, an entirely software embodiment (including firmware, resident software, micro-code, etc.), or an embodiment combining software and hardware aspects that may all generally be referred to herein as a "module" or "system." Furthermore, the present exemplary embodiments may take the form of a computer program product embodied in any tangible medium of expression having computer-usable program code embodied in the medium.

Additionally, any examples or illustrations given herein are not to be regarded in any way as restrictions on, limits to, or express definitions of any term or terms with which they are utilized. Instead, these examples or illustrations are to be regarded as being described with respect to one particular embodiment and as being illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such nonlimiting examples and illustrations includes, but is not limited to: "for example," "for instance," "e.g.," and "in one embodiment."

INDUSTRIAL APPLICABILITY

This invention can be applied to the computer networking field in which computer servers and similar components are managed, maintained, and utilized.

[Supplemental Notes]
[Supplemental Note 1]
1. A server rack comprising:
an air inlet configured to intake air from an outside of the server rack;
an air exhaust outlet configured to exhaust air to the outside of the server rack:
an inlet temperature sensor configured to measure the temperature of inlet air;
a heat exchanger provided at the air exhaust outlet of the server rack;
at least one power consumption sensor provided to a power supply of the server rack and configured to measure electrical power consumption of a server of the server rack; and
a heat exchange controller configured to control heat exchange between the heat exchanger and the exhaust air based on measurements from the inlet temperature sensor and the at least one power consumption sensor.

[Supplemental Note 2]
2. The server rack of Supplemental Note 1, wherein
the heat exchange controller is configured to determine a heat exchanger control parameter based on the measurement from the inlet temperature sensor and the measurement from the at least one power consumption sensor and controls at least one of a temperature of a refrigerant and a mass flow rate of the refrigerant such that heat is removed from the exhaust air when exhausted through the heat exchanger.

[Supplemental Note 3]
3. The server rack of Supplemental Note 2, wherein
the heat exchange controller is configured to store a predetermined table including stored inlet air temperature data and stored power consumption data, the heat exchanger control parameter being determined from the table.

[Supplemental Note 4]
4. The server rack of Supplemental Note 3, wherein
the predetermined table is obtained through experimentation in an environment with negligible external influence.

[Supplemental Note 5]
5. The server rack of Supplemental Note 2, wherein
the heat exchange controller is configured to determine the heat exchanger control parameter from a linear regression equation based on the power consumption measurement, the inlet air temperature measurement, and predetermined operational constants.

[Supplemental Note 6]
6. The server rack of Supplemental Note 5, wherein
the linear regression equation is:

$$Q\_rdhx = P\_in = C_0 + C_1 \times T\_in\_rack + C_2 \times m\_air\_in\_rack + C_3 \times m\_ref\_rdhx + C_4 \times T\_in\_ref\_rdhx$$

where,
Q_rdhx is thermal energy (kW) to be extracted by the heat exchanger; P_in is the power consumption of the server rack (kW); T_in_rack is inlet air temperature (° C.); m_air_in_rack is rack inlet air mass flow (kg/s); m_ref_rdhx is mass flow rate of refrigerant of the heat exchanger (kg/s); T_in_ref_rdhx is temperature of the refrigerant of the heat exchanger (° C.); and $C_0$, $C_1$, $C_2$, $C_3$, and $C_4$ are constants.

[Supplemental Note 7]
7. The server rack of Supplemental Note 2, wherein
the heat exchange controller is further configured to receive, as input, a refrigerant parameter model which is generated based on the measurement from the inlet temperature sensor and the measurement from the at least one power consumption sensor, and
the heat exchange controller is configured to determine the heat exchanger control parameter using the refrigerant parameter model.

[Supplemental Note 8]
8. The server rack of Supplemental Note 7, further comprising:
a refrigerant parameter estimator configured to communicate with the heat exchange controller, the refrigerant parameter estimator including:
a data collector configured to receive power consumption measurement data of servers in a server rack, inlet air temperature measurement data of a server rack, and cooling ability data of a rear door heat exchanger from a refrigerant controller;
a refrigerant parameter generator configured to generate a target refrigerant parameter from data received from the data collector, a refrigerant parameter model, and predefined key-value data, the target refrigerant parameter being used by the refrigerant controller to control cooling of the server rack;
a refrigerant parameter model creator configured to generate the refrigerant parameter model using data stored in a historical data database and configured to send the refrigerant parameter model to the refrigerant parameter generator; and
a refrigerant parameter tuner configured to generate a command for adjusting the target refrigerant parameter by using the power consumption measurement data and the cooling ability data received from the data collector, configured to send the command to the refrigerant parameter generator, and configured to store data in the historical data database.

[Supplemental Note 9]
9. A control device for a server rack, comprising:
a processing unit; and
an I/O unit configured to receive inlet air temperature measurement data and server rack power consumption measurement data and configured to output a heat exchange control parameter, wherein
the processing unit configured to determine the heat exchange control parameter based on the inlet air temperature measurement data and server rack power consumption measurement data.

[Supplemental Note 10]
10. A cooling method for a server rack, comprising the steps of:
measuring an inlet air temperature of the server rack;
measuring a power consumption of a server of the server rack;
determining a heat exchanger control parameter based on the inlet air temperature and the power consumption; and
controlling a heat exchanger to remove the heat removal amount from an exhaust air passing through the heat exchanger.

[Supplemental Note 11]
11. A non-transitory computer-readable medium storing a program causing a computer to execute the steps of:
measuring an inlet air temperature of the server rack;
measuring a power consumption of the server rack;
determining a heat exchanger control parameter based on the inlet air temperature and the power consumption; and
controlling a heat exchanger to remove the heat removal amount from an exhaust air passing through the heat exchanger.

REFERENCE SIGNS LIST

100 Server Rack
110 Rear Door Heat Exchanger
111 Inlet Air Temperature Sensor
112 Power Consumption Sensor
113 Control Unit
115 Exhaust Air Temperature Sensor
120 Air Inlet
121 Air Exhaust Outlet
130 Server
131 Server Fan
140 Refrigerant Supply Line
150 Refrigerant Return Line
160 Central Processing Unit
161 Memory Unit
162 I/O Unit
163 Temperature Data Input
164 Power Consumption Data Input
165 Control Signal Output
170 Refrigerant Parameter Estimator
171 Data Collector
172 Refrigerant Parameter Generator
173 Refrigerant Parameter Model Creator
174 Refrigerant Parameter Tuner
175 Default Control Database
176 Historical Data Database
210 Inlet Air
215 Rear Door Inlet Air

The invention claimed is:

1. A server rack comprising:
an air inlet configured to intake air from an outside of the server rack;
an air exhaust outlet configured to exhaust air to the outside of the server rack;
an inlet temperature sensor configured to measure the temperature of inlet air;
a heat exchanger provided at the air exhaust outlet of the server rack;
at least one power consumption sensor provided to a power supply of the server rack and configured to measure electrical power consumption of the server rack; and
a heat exchange controller configured to control heat exchange between the heat exchanger and the exhaust air based on an inlet air temperature measurement from the inlet temperature sensor and a power consumption measurement from the at least one power consumption sensor, wherein
the heat exchange controller is configured to determine a heat exchange control parameter from a linear regression equation based on the inlet air temperature measurement from the inlet temperature sensor, the power consumption measurement from the at least one power consumption sensor, and predetermined constants, and to control at least one of a temperature of a refrigerant and a mass flow rate of the refrigerant such that heat is removed from the exhaust air when exhausted through the heat exchanger.

2. The server rack of claim 1, wherein the linear regression equation is:

$$Q\_rdhx = P\_in = C_0 + C_1 \times T\_in\_rack + C_2 \times m\_air\_in\_rack + C_3 \times m\_ref\_rdhx + C_4 \times T\_in\_ref\_rdhx$$

where,
$Q\_rdhx$ is thermal energy (kW) to be extracted by the heat exchanger; $P\_in$ is the power consumption measurement of the server rack (kW); $T\_in\_rack$ is the inlet air temperature measurement (° C.); $m\_air\_in\_rack$ is inlet air mass flow rate of the server rack (kg/s); $m\_ref\_rdhx$ is mass flow rate of refrigerant of the heat exchanger (kg/s); $T\_in\_ref\_rdhx$ is temperature of the refrigerant of the heat exchanger (° C.); and $C_0, C_1, C_2, C_3,$ and $C_4$ are the predetermined constants.

3. A control device for a server rack, comprising:
a processing unit configured to control a server rack, wherein the server rack comprises: an air inlet configured to intake air from an outside of the server rack; an air exhaust outlet configured to exhaust air to the outside of the server rack; an inlet temperature sensor configured to measure the temperature of inlet air; a heat exchanger provided at the air exhaust outlet of the server rack; and at least one power consumption sensor provided to a power supply of the server rack and configured to measure electrical power consumption of the server rack; and
an input and output unit configured to receive an inlet air temperature measurement from an inlet temperature sensor and to receive a power consumption measurement of the server rack from the at least one power consumption sensor and configured to output a heat exchange control parameter, wherein
the processing unit is configured to determine the heat exchange control parameter from a linear regression equation based on the inlet air temperature measurement, power consumption measurement, and predetermined constants, and to control at least one of a temperature of a refrigerant and a mass flow rate of the refrigerant such that heat is removed from the exhaust air when exhausted through the heat exchanger.

4. A cooling method for a server rack,
the server rack comprising:
an air inlet configured to intake air from an outside of the server rack;
an air exhaust outlet configured to exhaust air to the outside of the server rack;
an inlet temperature sensor;
a heat exchanger provided at the air exhaust outlet of the server rack;
at least one power consumption sensor provided to a power supply of the server rack,
the cooling method comprising
measuring, by the inlet temperature sensor, an inlet air temperature of the server rack;
measuring, by the at least one power consumption sensor, electrical power consumption of the server rack;
determining a heat exchange control parameter from a linear regression equation based on a measurement of the inlet air temperature, a measurement of the power consumption, and predetermined constants; and
controlling at least one of a temperature of a refrigerant and a mass flow rate of the refrigerant such that heat is removed from the exhaust air when exhausted through the heat exchanger.

* * * * *